United States Patent [19]

Wei et al.

[11] Patent Number: 5,276,347
[45] Date of Patent: Jan. 4, 1994

[54] GATE OVERLAPPING LDD STRUCTURE

[75] Inventors: Che-Chia Wei, Plano; Ravishankar Sundaresan, Garland, both of Tex.

[73] Assignee: SGS-Thomson Microelectronics, Inc., Carrollton, Tex.

[21] Appl. No.: 809,398

[22] Filed: Dec. 18, 1991

[51] Int. Cl.$^5$ .................................. H01L 29/78
[52] U.S. Cl. .................... 257/388; 257/387; 257/401; 257/412
[58] Field of Search .............. 357/23.3, 23.9, 59; 257/387, 388, 401, 412

[56] References Cited

U.S. PATENT DOCUMENTS

| | | | |
|---|---|---|---|
| 4,354,309 | 10/1982 | Gardiner et al. | 29/571 |
| 4,963,504 | 10/1990 | Huang | 437/44 |
| 4,984,042 | 1/1991 | Pfiester et al. | 357/23.9 |
| 5,023,679 | 6/1991 | Shibata | 357/23.4 |
| 5,053,849 | 10/1991 | Izawa et al. | 357/59 |
| 5,061,647 | 10/1991 | Roth et al. | 437/40 |
| 5,091,763 | 2/1992 | Sanchez | 357/23.9 |

OTHER PUBLICATIONS

"A Novel Submicron LDD Transistor With Inverse-T Gate Structure", by Tiao-yuan Huang, et al, IEDM 1986, pp. 742-745.

Primary Examiner—Andrew J. James
Assistant Examiner—Stephen D. Meier
Attorney, Agent, or Firm—Lisa K. Jorgenson; Kenneth C. Hill; Richard K. Robinson

[57] ABSTRACT

A method is provided for forming a gate overlap LDD structure of an integrated circuit, and an integrated circuit formed according to the same. An oxide layer is formed over a substrate. A four layered gate electrode is formed in an inverse T shape. A first polysilicon layer is formed over the underlying oxide layer. A first conductive layer is formed over the first polysilicon layer. A second polysilicon layer is formed over the first conductive layer. A second conductive layer is then formed over the second polysilicon layer. The second conductive and polysilicon layers are etched to expose a portion of the underlying first conductive layer. Lightly doped drain regions are formed in the substrate adjacent to the second conductive and polysilicon layers. Sidewall oxide spacers are formed on the sides of the second conductive and polysilicon layers and on top of the first conductive layer. The first conductive and polysilicon layers are etched exposing a portion of the underlying oxide layer. Source/drain regions are formed in the substrate adjacent to the first conductive and polysilicon layers.

8 Claims, 1 Drawing Sheet

5,276,347

GATE OVERLAPPING LDD STRUCTURE

FIELD OF THE INVENTION

The present invention relates generally to semiconductor integrated circuits, and more specifically to forming an improved gate overlap lightly doped drain (LDD) structure.

BACKGROUND OF THE INVENTION

With the trend to continue to miniaturize semiconductor integrated circuits to achieve submicron feature sizes, packing density becomes important. The number of components that can be manufactured on a chip can be increased through the decrease of the horizontal dimensions of the various components. However, horizontal dimensions cannot be scaled down without a corresponding decrease in the components' vertical dimensions.

Several approaches to scale down the size of transistors have been proposed in the prior art. One approach to scale down the size of a transistor is to decrease all dimensions by the same factor. When all dimensions are decreased, including the depth of the source/drain regions, a decrease in the surface concentration of dopants in the source/drain regions occurs. This approach may cause problems in transistor fabrication, more specifically in the electrical characteristics of the source/drain regions. Such a decrease in dopant concentration along with a shallower junction of the source/drain depth causes an unwanted increase in the resistivity of the source/drain regions. Another approach is to maintain the junction depth and original dopant concentration while decreasing the horizontal dimensions. This method may result, however, in unacceptable short channels. An additional approach is to increase the dopant concentration while decreasing the junction depth of the source/drain regions. This method may provide for acceptable resistivities of the source/drain regions. However, the dopant gradient is higher in a shallower junction generating a large electrical field. Such an effect is responsible for the "hot electron" problem which degrades the transistor and leads to reliability problems.

A well known solution to the transistor scaling problem involves forming lightly doped drain (LDD) regions. The LDD structures are formed by using two implantation steps when forming the source/drain regions. After the gate electrodes are formed, a first implant with an N-type dopant is made to form a lightly doped, very shallow source and drain. Sidewall oxide spacers are formed along the sides of the gate electrode. A second implant is then made with a large dose of dopant into the source/drain regions. This second implant is made to reduce the resistivity in these regions. The heavier implant is masked by the gate and the sidewall oxide spacers. Thus, the source/drain regions adjacent to the gate are lightly doped and the regions adjacent to the sidewall oxide spacers are heavily doped.

Problems have occurred in forming the LDD structures using the sidewall oxide spacers. Negative charges may build up on top of the LDD structure not directly under the gate electrode. As reported in "A Novel Submicron LDD Transistor With Inverse-T Gate Structure'" by Tiao-yuan Huang et al, published in 1986 in the IEDM, pages 742–745, the LDD region may become depleted by the trapped negative charges. The source/drain resistance may thus increase causing a faster degradation rate of the transistor.

Tiao-yuan Huang et al proposed an inverse-T LDD transistor to eliminate the oxide sidewall "spacer induced degradation." At gate formation, the polysilicon gate is only partially etched instead of being etched down to the gate oxide layer as in the conventional LDD transistor. A thin polysilicon layer is left on the oxide layer. The first implant is made to form the N⁻LDD regions. Sidewall oxide spacers are formed along the sidewalls of the polysilicon gate and on top of the thin layer of polysilicon adjacent to the gate. The remaining thin layer of polysilicon is then removed and the second heavy implant is made to form the source/drain regions using the spacers as a mask. The source/drain regions thus become self-aligned to the gate having an inverse-T shape.

While this process of forming LDD regions increases device reliability and eliminates the "spacer-induced degradations," this process has inherent manufacturing limitations. The method of etching partially through the polysilicon layer is difficult to control to obtain both a desired structure and thickness. It would therefore be desirable to provide a method which produces a reliable inverse T transistor having the desired structure and thickness. It would also be desirable for such a technique to reduce the channel electric field and eliminate the "spacer-induced degradation." It would further be desirable for such technique to be easily adapted for use with standard integrated circuit fabrication process flows without increasing the complexity of the process.

SUMMARY OF THE INVENTION

The invention may be incorporated into a method for forming an integrated circuit, and the integrated circuit formed thereby, by forming an oxide layer over a substrate. A four layer stacked gate electrode is formed over the oxide layer in an inverse T shape. A first conductive layer overlies a portion of the underlying oxide layer. A second conductive layer overlies the first conductive layer. A third conductive layer overlies a portion of the second conductive layer and a fourth conductive layer overlies the third conductive layer. Sidewall oxide spacers are formed on the sides of the third and fourth conductive layers and on top of the second conductive layer. Source/drain regions are formed in the substrate adjacent to the gate electrode wherein the source/drain regions have a lightly doped drain region adjacent to the third and fourth conductive layers.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
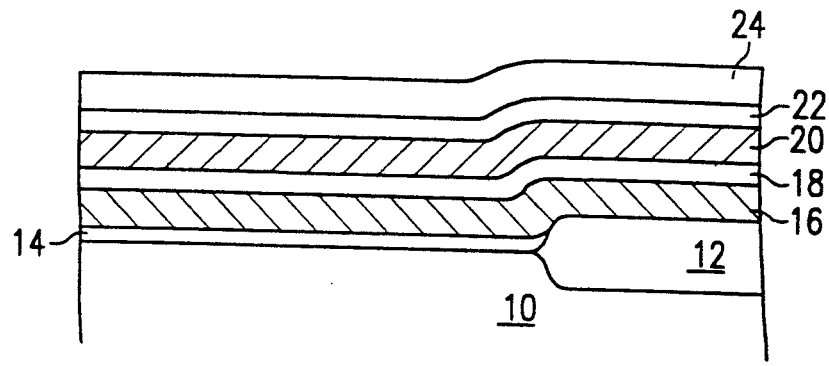
FIGS. 1–4 are cross-sectional views of the fabrication of a semiconductor device structure according to the present invention.

Referring to FIG. 1, an integrated circuit is to be formed on a silicon substrate 10 A field oxide region 12 is generally made in an area on the substrate as known in the art to separate active areas. Oxide layer 14 is formed on the substrate 10 in the areas not covered by the field oxide. A first conductive layer 16 is then formed over the surface of the integrated circuit. Layer 16 will typically be a polysilicon layer having a thickness of between approximately 500 to 700 angstroms. Layer 16 may also be an amorphous silicon layer. A second conductive layer 18 is formed over the polysilicon layer 16. Layer 18 may typically be a refractory metal layer such as tungsten, titanium nitride or other refractory metal commonly used in semiconductor processing. Layer 18 will typically have a thickness of between approximately 100 to 300 angstroms.

A third conductive layer 20 will be formed over the second conductive layer 18 and a fourth conductive layer 22 will be formed over the third conductive layer. Layer 20 may typically be a polysilicon or amorphous silicon layer having a thickness of between approximately 1000 to 2000 angstroms. Layer 22 may typically be a refractory metal layer such as those listed above for layer 18. A photoresist layer 24 is then formed over the fourth conductive layer 22. The resulting structure at this point is a four layered stack of a polysilicon/refractory metal/polysilicon/refractory metal combination.

Figure 2:
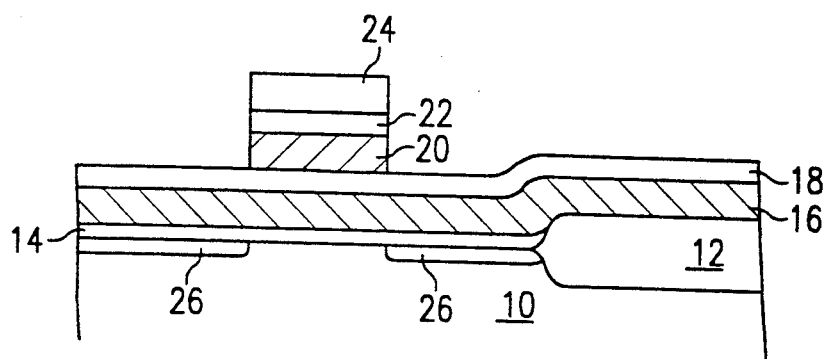

Referring to FIG. 2, photoresist layer 24 is patterned. The fourth conductive layer 22 of a refractory metal is selectively etched using the third conductive layer 20 of polysilicon as an etch stop. The third layer 20 is then selectively etched using the second conductive layer 18 of a refractory metal as an etch stop. At this stage, LDD regions 26 are formed in the substrate adjacent to the third and fourth conductive layers. The LDD regions 26 are formed by implanting an N-type dopant such as phosphorus. This implant forms lightly doped, very shallow N−regions.

Figure 3:
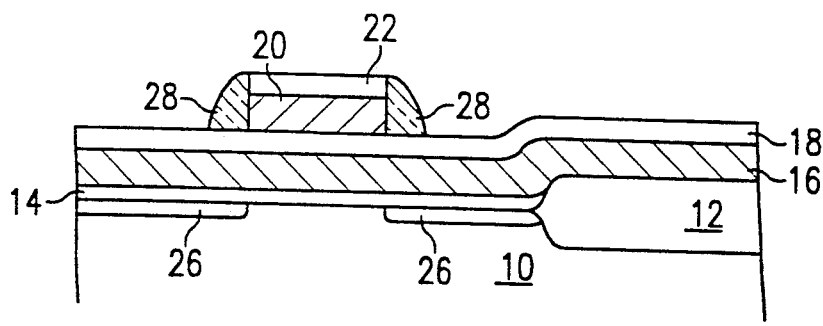

Referring to FIG. 3, photoresist layer 24 is removed. Sidewall oxide spacers 28 are then formed by methods known in the art on the sidewalls of the third and fourth conductive layers 20, 22 and on top of the second conductive layer 18. The second layer 18 of a refractory metal is then selectively etched using the first layer 16 of a polysilicon as an etch stop. The fourth conductive layer 22 of a refractory metal will not be etched away with layer 18 where the two layers comprise different refractory metals. Layer 16 is then etched using the underlying oxide layer as an etch stop. The gate electrode thus comprises four layers in an inverse T shape. The precise shape and thickness of the final form of the gate electrode can be controlled through the use of two polysilicon layers and two refractory metal layers. Moreover, the refractory metal layers can also serve to lower the sheet resistance of the gate polysilicon.

Figure 4:
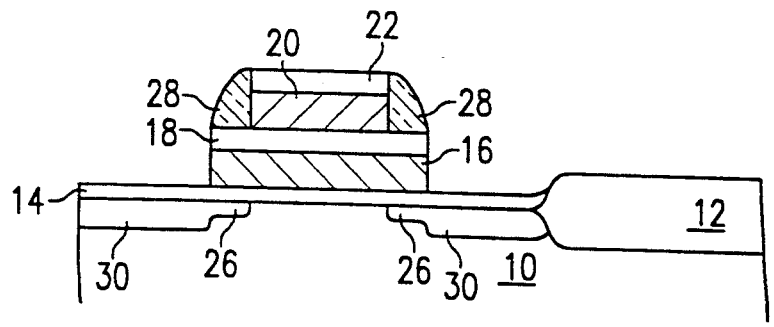

Referring to FIG. 4, a second implant is done to form the source/drain regions 30. This implant is a large dose of dopant such as arsenic or antimony to form N+regions adjacent to the first and second conductive layers 16, 18. The sidewall oxide spacers act as a mask to insure that the heavy second implant only reaches the edges of the oxide spacers. The "spacer-induced degradations" are eliminated. The lightly doped regions are adjacent to the transistor channel while the heavily doped regions do not reach the channel. Thus, the resistance of the source/drain regions are lowered and the channel electric field is reduced. This method of forming the gate overlap LDD regions provides better control of forming the inverse-T shape with each of the layers acting as an etch stop for the previous layer.

As will be appreciated by those skilled in the art, the process steps described above can be used with nearly any conventional process flow. While the invention has been particularly shown and described with reference to a preferred embodiment, it will be understood by those skilled in the art that various changes in form and detail may be made therein without departing from the spirit and scope of the invention.

What is claimed is:

1. A structure consisting of a portion of semiconductor integrated circuit, comprising:
   a substrate;
   an oxide layer overlying a portion of the substrate;
   an inverse T gate electrode having a first conductive layer overlying a portion of the oxide layer, a second conductive layer overlying the first conductive layer, a third conductive layer overlying a central portion of the second conductive layer, and a fourth conductive layer overlying the third conductive layer, wherein the first and second conductive layers comprise silicon and the second and fourth conductive layers comprise refractory metals;
   sidewall oxide spacers adjacent to the third and fourth conductive layers and on top of the second conductive layer; and,
   source/drain regions in the substrate adjacent to the gate electrode having lightly doped drain regions adjacent to the third and fourth conductive layers.

2. The structure of claim 1, wherein the first and third conductive layers comprise polysilicon.

3. The structure of claim 1, wherein the first and third conductive layers comprise silicon.

4. The structure of claim 1, wherein the refractory metal comprises tungsten.

5. The structure of claim 1, wherein the refractory metal comprises titanium nitride.

6. The structure of claim 1, wherein the first conductive layer has a thickness of between approximately 500 to 700 angstroms.

7. The structure of claim 1, wherein the second conductive layer has a thickness of between approximately 100 to 300 angstroms.

8. The structure of claim 1, wherein the third conductive layer has a thickness of between approximately 1000 to 2000 angstroms.

* * * * *